(12) United States Patent
Koo

(10) Patent No.: US 9,807,843 B2
(45) Date of Patent: Oct. 31, 2017

(54) WHITE LIGHT EMITTING MODULE AND LED LIGHTING APPARATUS

(71) Applicant: Samsung Electronics Co., Ltd., Suwon-si (KR)

(72) Inventor: Won Hoe Koo, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/191,022

(22) Filed: Jun. 23, 2016

(65) Prior Publication Data

US 2017/0181241 A1   Jun. 22, 2017

(30) Foreign Application Priority Data

Oct. 2, 2015 (KR) .................. 10-2015-0139390

(51) Int. Cl.

| | |
|---|---|
| H05B 37/02 | (2006.01) |
| H05B 33/08 | (2006.01) |
| H01L 33/56 | (2010.01) |
| H01L 33/50 | (2010.01) |
| H01L 27/15 | (2006.01) |
| F21K 9/235 | (2016.01) |

(Continued)

(52) U.S. Cl.
CPC ....... *H05B 33/0854* (2013.01); *H01L 27/153* (2013.01); *H01L 33/502* (2013.01); *H01L 33/56* (2013.01); *H05B 33/0866* (2013.01); *H05B 37/0272* (2013.01); *F21K 9/235* (2016.08); *F21K 9/237* (2016.08); *F21K 9/238* (2016.08); *F21V 29/77* (2015.01); *F21Y 2113/13* (2016.08); *F21Y 2115/10* (2016.08)

(58) Field of Classification Search
CPC ............ H05B 33/0845; H05B 33/0854; H05B 33/0857; H05B 33/0866
USPC ........ 315/149–152, 155, 291, 294, 297, 307
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |

(Continued)

FOREIGN PATENT DOCUMENTS

| | | |
|---|---|---|
| KR | 10-2004-0067757 | 7/2004 |
| KR | 10-2011-0030967 | 3/2011 |

(Continued)

*Primary Examiner* — Jason M Crawford
(74) *Attorney, Agent, or Firm* — Muir Patent Law, PLLC

(57) ABSTRACT

An LED lighting apparatus may comprise a white light emitting module including a first white LED package emitting first white light corresponding to a quadrangular region defined by (0.3100, 0.3203), (0.3082, 0.3301), (0.3168, 0.3388) and (0.3179, 0.3282) in the CIE 1931 chromaticity diagram, a second white LED package emitting second white light corresponding to a quadrangular region defined by (0.4475, 0.3994), (0.4571, 0.4173), (0.4695, 0.4207) and (0.4589, 0.4021) in the CIE 1931 chromaticity diagram, a green LED package emitting green light having a peak wavelength of 520 nm to 545 nm, and a driving controller controlling levels of luminous flux of the first white light and the second white light to select a color temperature of desired white light and controlling a luminous flux of the green LED package so as to reduce a difference between color coordinates corresponding to the selected color temperature of the white light, and a black body locus.

19 Claims, 14 Drawing Sheets

(51) Int. Cl.
*F21K 9/238* (2016.01)
*F21K 9/237* (2016.01)
*F21V 29/77* (2015.01)
*F21Y 115/10* (2016.01)
*F21Y 113/13* (2016.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,972,028 B2 | 7/2011 | Durand et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,018,135 B2 * | 9/2011 | Van De Ven ........ H05B 33/086 313/498 |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,358,089 B2 | 1/2013 | Hsia et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2006/0066266 A1 * | 3/2006 | Li Lim ............ G02F 1/133603 315/291 |
| 2008/0297054 A1 * | 12/2008 | Speier ................ H05B 33/0869 315/152 |
| 2010/0277410 A1 * | 11/2010 | You ...................... G09G 3/3413 345/102 |
| 2010/0315012 A1 * | 12/2010 | Kim ......................... F21K 9/00 315/185 R |
| 2012/0286669 A1 * | 11/2012 | Yan .................... H05B 33/0869 315/151 |
| 2013/0049052 A1 | 2/2013 | Son |
| 2013/0082612 A1 | 4/2013 | Kim et al. |
| 2014/0062297 A1 * | 3/2014 | Bora .................. H05B 33/0863 315/34 |
| 2015/0029713 A1 | 1/2015 | Fieberg et al. |

FOREIGN PATENT DOCUMENTS

| | | |
|---|---|---|
| KR | 10-2011-0113676 | 10/2011 |
| KR | 10-2013-0023841 | 3/2013 |

* cited by examiner

WHITE LIGHT EMITTING MODULE AND LED LIGHTING APPARATUS

CROSS-REFERENCE TO RELATED APPLICATION

This application claims the priority and benefit of Korean Patent Application No. 10-2015-0139390 filed on Oct. 2, 2015, with the Korean Intellectual Property Office, the disclosure of which is incorporated herein by reference.

BACKGROUND

The present exemplary implementations of the herein described subject matter relate to an LED lighting apparatus and a white light emitting module.

A light emitting diode (hereinafter, referred to as an 'LED'), a semiconductor device converting electrical energy into light energy, may be configured of a compound semiconductor emitting light having a specific wavelength according to an energy band gap. Such LEDs are becoming widely used as light sources in the fields of lighting apparatuses as well as in display devices such as mobile displays, televisions, and computer monitors.

In general, LED lighting apparatuses may produce white light by exciting wavelength conversion materials such as phosphors, using a semiconductor light emitting device generating light ranging from ultraviolet light to blue light as an excitation light source. In particular, light emitting apparatuses capable of providing white light having a color temperature appropriate to user demands and usage environments by varying the color temperature of white light have been suggested.

SUMMARY

An aspect of the present exemplary implementations relate to an LED lighting apparatus and a white light emitting module, capable of adjusting a variable color line in such a manner that color coordinates of white light may be changed adjacently to a black body locus (BBL) when a color temperature of white light is varied.

According to an example exemplary implementation, an LED lighting apparatus may include a light housing; a white light emitting module mounted in the light housing; and a power supply unit supplying power to the white light emitting module. The white light emitting module includes: a first white LED package emitting first white light corresponding to a quadrangular region defined by (0.3100, 0.3203), (0.3082, 0.3301), (0.3168, 0.3388) and (0.3179, 0.3282) in the CIE 1931 chromaticity diagram, a second white LED package emitting second white light corresponding to a quadrangular region defined by (0.4475, 0.3994), (0.4571, 0.4173), (0.4695, 0.4207) and (0.4589, 0.4021) in the CIE 1931 chromaticity diagram, a green LED package emitting green light having a peak wavelength of 520 nm to 545 nm, and a driving controller controlling levels of luminous flux of the first white light and the second white light to select a color temperature of desired white light and controlling a luminous flux of the green LED package so as to reduce a difference between color coordinates corresponding to the selected color temperature of the white light, and a black body locus in the CIE 1931 chromaticity diagram.

When a luminous flux ratio of the first white light, a luminous flux ratio of the second white light, and a luminous flux ratio of the green light are indicated as W1, W2 and G, respectively, W1+W2+G=100%, and each of W1 and W2 may be complementarily changed within a range of 0 to 100%. The luminous flux ratio G of the green light may be changed within a range of 0 to 10%.

A color temperature of finally emitted white light may be changed within a color temperature range of 2700K to 6500K.

A color rendering index (CRI) of finally emitted white light may be 80 or more.

Color coordinates of finally emitted white light may be substantially changed according to the black body locus.

The green light emitted by the green LED package may have a full width at half maximum (FWHM) of 10 to 50 nm.

At least one of the first white LED package and the second white LED package may include a plurality of white LED packages. In this case, at least a portion of the plurality of white LED packages may emit light corresponding to different color coordinates in the CIE 1931 chromaticity diagram, and types of light emitted by the plurality of white LED packages may be mixed to allow for the emission of the first or the second white light.

The first white LED package and the second white LED package may respectively include a plurality of white LED packages, and may be alternately disposed. The green LED package may include a plurality of green LED packages. The first white LED package and the second white LED package and the green LED packages may be disposed to be bisymmetrical to each other or rotationally symmetrical to each other.

The LED lighting apparatus further includes: a light detector detecting and analyzing finally emitted white light, wherein the driving controller receives analyzed information on the white light and based on received information, controls a luminous flux of at least one of the first white LED package and the second white LED package and the green LED package.

The LED lighting apparatus further includes: a light diffuser disposed in an emission direction of final white light.

According to an exemplary implementation, a white light emitting module may include: a first white LED package emitting first white light corresponding to a quadrangular region defined by (0.3100, 0.3203), (0.3082, 0.3301), (0.3168, 0.3388) and (0.3179, 0.3282) in the CIE 1931 chromaticity diagram, a second white LED package emitting second white light corresponding to a quadrangular region defined by (0.4475, 0.3994), (0.4571, 0.4173), (0.4695, 0.4207) and (0.4589, 0.4021) in the CIE 1931 chromaticity diagram, a green LED package emitting green light having a peak wavelength of 520 nm to 545 nm, and a driving controller controlling levels of luminous flux of the first white light and the second white light to select a color temperature of desired white light and controlling a luminous flux of the green LED package so as to reduce a difference between color coordinates corresponding to the selected color temperature of the white light, and a black body locus in the CIE 1931 chromaticity diagram.

According to an exemplary implementation, a white light emitting module may include: a plurality of first white LED packages emitting first white light corresponding to a quadrangular region defined by (0.3100, 0.3203), (0.3082, 0.3301), (0.3168, 0.3388) and (0.3179, 0.3282) in the CIE 1931 chromaticity diagram, a plurality of second white LED packages emitting second white light corresponding to a quadrangular region defined by (0.4475, 0.3994), (0.4571, 0.4173), (0.4695, 0.4207) and (0.4589, 0.4021) in the CIE 1931 chromaticity diagram, at least one green LED package emitting green light, and a driving controller individually controlling levels of luminous flux of the first white light and the second white light and a luminous flux of the green light in such a manner that a color temperature of final white light is substantially varied according to a black body locus in the CIE 1931 chromaticity diagram.

In the CIE 1931 chromaticity diagram, a difference between color coordinates of the white light, the color temperature of which is varied, and the black body locus may be maintained to be within 0.005.

BRIEF DESCRIPTION OF DRAWINGS

The above and other aspects, features and advantages of the present exemplary implementations will be more clearly understood from the following detailed description taken in conjunction with the accompanying drawings, in which.

DETAILED DESCRIPTION

Figure 1:
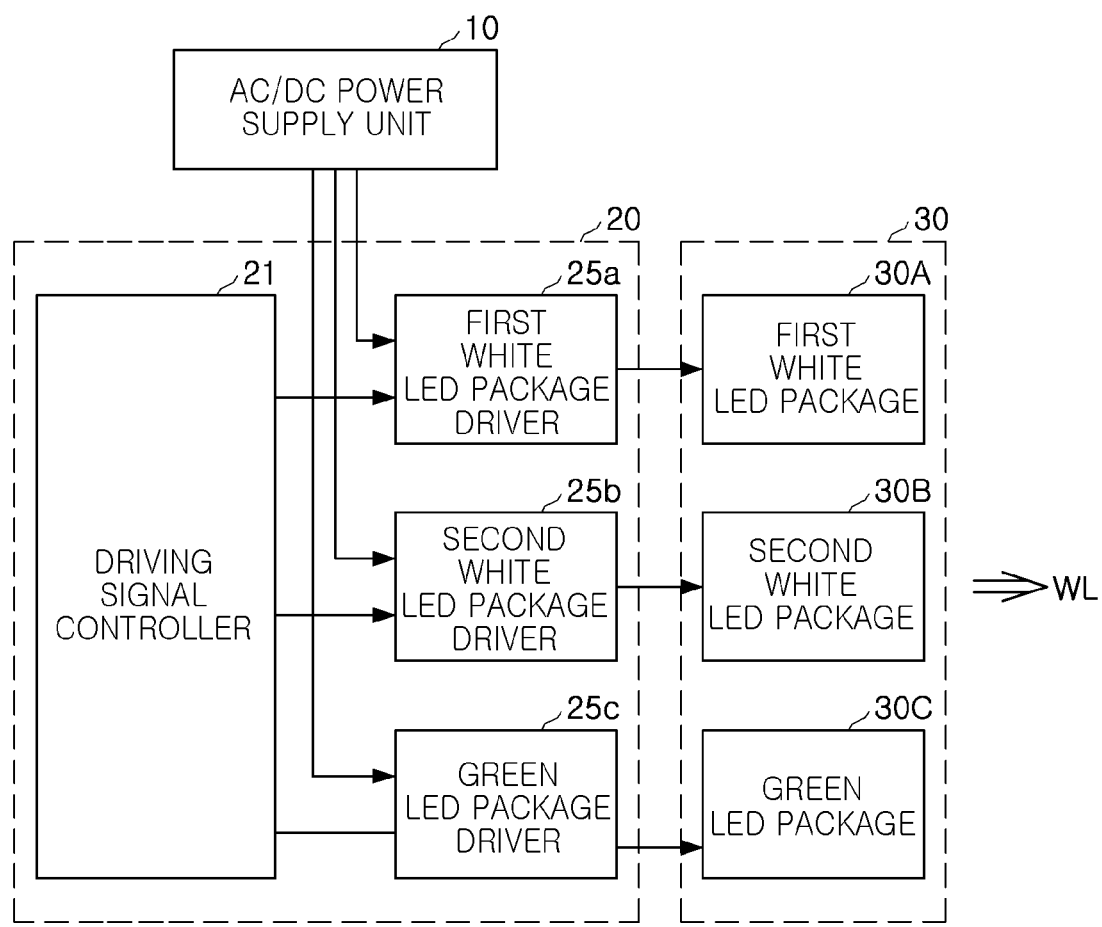
FIG. 1 is a block diagram illustrating main constitutions of an LED lighting apparatus according to an example exemplary implementation.

Hereinafter, exemplary implementations of the herein described subject matter will be described as follows with reference to the attached drawings.

The exemplary implementations may, however, be exemplified in many different forms and should not be construed as being limited to the specific exemplary implementations set forth herein. Rather, these exemplary implementations are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular exemplary implementations only and is not intended to be limiting of any inventive concepts. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, exemplary implementations will be described with reference to schematic views illustrating the exemplary implementations. In the drawings, for example, due to manufacturing techniques and/or tolerances, modifications of the shape shown may be estimated. Thus, exemplary implementations should not be construed as being limited to the particular shapes of regions shown herein. The following exemplary implementations may also be constituted by one or a combination thereof.

The contents of the exemplary implementations described below may have a variety of configurations and only describe or show a required configuration herein, but are not limited thereto.

FIG. 1 is a block diagram illustrating main constitutions of an LED lighting apparatus according to an example exemplary implementation.

As shown in FIG. 1, an LED lighting apparatus 50 may include white light emitting modules 20 and 30 and a power supply unit 10 supplying power to the white light emitting modules. The white light emitting modules illustrated in FIG. 1 may be mounted in housings formed in various manners (Refer to FIG. 12 through FIG. 14).

The power supply unit 10 may convert a AC current into a DC current and may be connected to respective first and second white LED package drivers 25a and 25b and a green LED package driver 25c to supply power of the converted current thereto.

The white light emitting module 20 may include a driving signal controller 21. The white light emitting module 30 may include a first white LED package 30A for cool white light and a second white LED package 30B for warm white light, and first white light and second white light emitted by the first white LED package 30A and the second white LED package 30B may define a color temperature variation section of the lighting apparatus 50 according to the example exemplary implementation.

In order to obtain color temperature variations adjacent to a black body locus, the first white light may correspond to a quadrangular region defined by coordinates (0.3100, 0.3203), (0.3082, 0.3301), (0.3168, 0.3388) and (0.3179, 0.3282) in the CIE 1931 chromaticity diagram. The second white light may correspond to a quadrangular region defined by coordinates (0.4475, 0.3994), (0.4571, 0.4173), (0.4695, 0.4207) and (0.4589, 0.4021) in the CIE 1931 chromaticity diagram. Each of the first white LED package 30A and the second white LED package 30B satisfying such color coordinate conditions may be configured of an array of a plurality of LED packages. The array of the plurality of LED packages may be prepared such that white light mixed by appropriately combining LED packages binned according to a plurality of color coordinates regions may emit desired white light (Refer to FIG. 7).

The driving signal controller 21 provides a driving signal for individually controlling three drivers the first and second white LED package drivers 25a and 25b and the green LED package driver 25c.

The first and second white LED package drivers 25a and 25b may be connected to the power supply unit 10 to receive power, and may supply an amount of current controlled by the driving signal of the driving signal controller 21 to the first white LED package 30A and the second white LED package 30B, whereby the first white LED package 30A and the second white LED package 30B may be respectively driven to emit white light having a desired lumen flux.

The white light emitting module 30 may further include a green LED package 30C. When variations are made in the color space diagram by adjusting a luminous flux ratio of the first white LED package 30A and the second white LED package 30B, green light emitted by the green LED package 30C may adjust color coordinates of varied (or finally) white light WL upwardly to be close to a black body locus (BBL) and may serve to decrease an interval therebetween. The green LED package driver 25c may be connected to the power supply unit 10 to receive power and may supply an amount of current controlled by the driving signal of the driving signal controller 21 to the green LED package 30C, and the green LED package 30C may emit green light with an amount of luminous flux required to adjust the coordinates upwardly. The green light may have a peak wavelength of 520 nm to 545 nm. For example, the green light may have a full width at half maximum (FWHM) of 10 to 50 nm.

Figure 2:
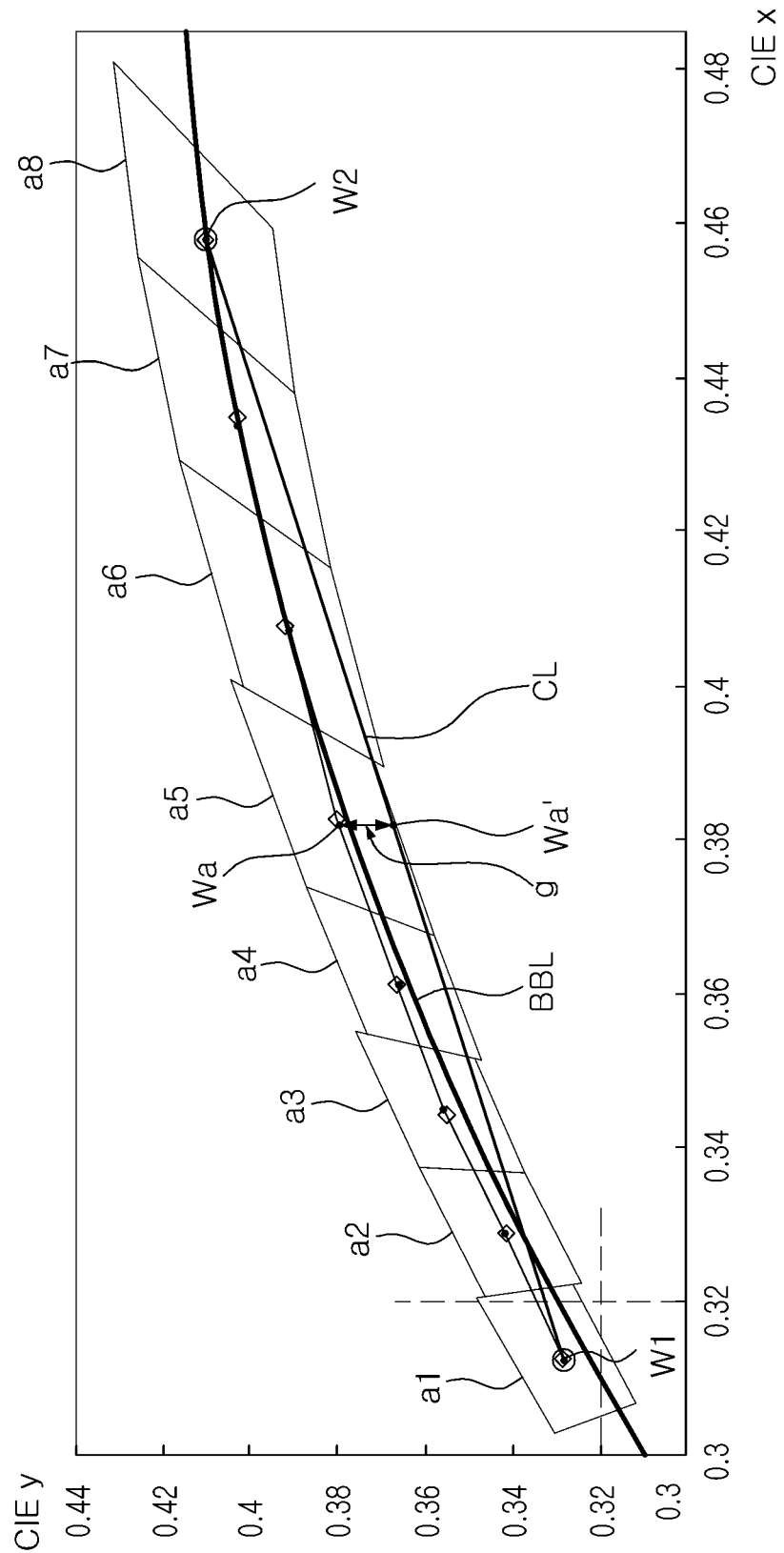
FIG. 2 is the CIE 1931 chromaticity diagram illustrating a color variation principle of the LED lighting apparatus according to an example exemplary implementation.

As shown in FIG. 2, a color temperature variation principle that applies to the exemplary implementation will be described in more detail.

As illustrated in FIG. 2, the first white LED package 30A and the second white LED package 30B may emit first white light and second white light indicated as "W1" and "W2", respectively, and may adjust luminous flux ratios of the first white light and the second white light in order to obtain desired color temperatures in a color temperature section defined by the first white light W1 and the second white light W2. For example, when a desired color temperature of white light Wa is determined, the driving signal controller 21 may generate a driving signal for each of the first and second white LED package drivers 25a and 25b and may transmit the driving signal thereto. The first and second white LED package drivers 25a and 25b may drive the first white LED package 30A and the second white LED package 30B to emit the first white light W1 and the second white light W2 with a luminous flux ratio according to the received driving signal.

In this case, as can be seen in FIG. 2, since color variations using luminous flux ratios of the first white light W1 and the second white light W2 are almost linearly made along a line indicated as "CL", light Wa' in which only the first white light W1 and the second white light W2 are mixed may significantly deviate from the black body locus (BBL) and thus, desired white light of the CIE standard may not be obtained. The green LED package 30C may be driven such that color coordinates of the light Wa may be adjusted upwardly by an amount substantially equal to a distance "g" from the black body locus (BBL). Accurately, color coordinates of white light WL may be positioned on the black body locus (BBL), but in most of actual driving operations, the color coordinates may be adjusted to be adjacent to the black body locus, that is, the color coordinates may be adjusted such that a distance between the coordinates and the nearest point of the black body locus (BBL) in the CIE 1931 chromaticity diagram is 0.005 or less.

In this manner, during a driving operation for color temperature variations, the green LED package may be driven at an appropriate luminous flux according to the luminous flux ratio of the first white light W1 and the second white light W2, whereby color coordinates of finally emitted white light WL may be adjacent to the black body locus (BBL).

Figure 3:
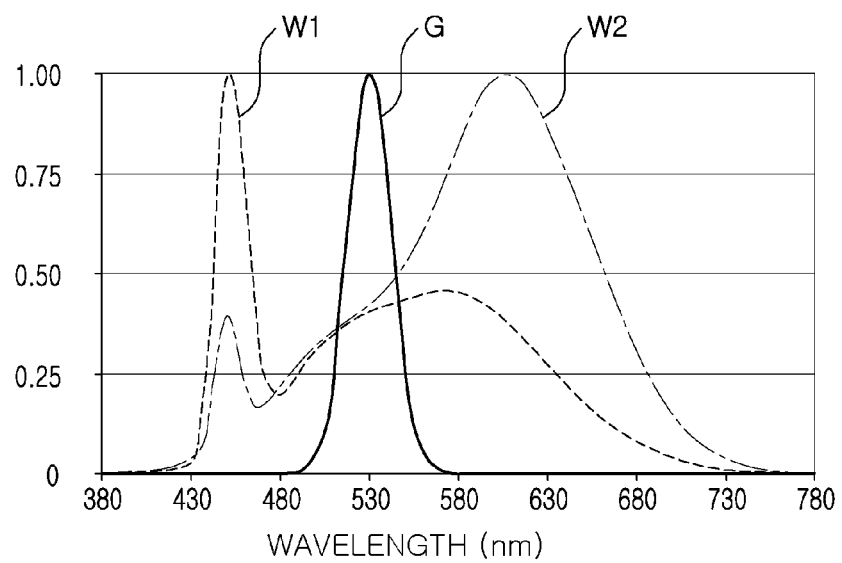
FIG. 3 illustrates spectra of light emitted by first and second white LED packages and a green LED package employable in the LED lighting apparatus according to an example exemplary implementation.

FIG. 3 illustrates spectra of light emitted by first and second white LED packages and a green LED package employable in the LED lighting apparatus according to an example exemplary implementation.

As shown in FIG. 3, spectra of the first and second white light and the green light are illustrated. A color temperature of the first white light and a color temperature of the second white light may be 6500K and 2700K, respectively, and the green light may have a peak wavelength of 530 nm and a FWHM of 30 nm.

Levels of luminous flux of the first white light and the second white light may be controlled to vary the color temperatures from 6500K to 2700K, and according to the varied color temperatures, a luminous flux ratio of the green light may be controlled to provide white light adjacent to the black body locus (BBL). Table 1 illustrates various white light characteristics (for example, a color rendering index (CRI) and R9), together with luminous flux ratios and color coordinates according to color temperature variations of white light.

TABLE 1

| | Color Temperature | | | | | | | |
|---|---|---|---|---|---|---|---|---|
| | 6500 K | 5700 K | 5000 K | 4500 K | 4000 K | 3500 K | 3000 K | 2700 K |
| Luminous Flux Ratio W1 | 100% | 83% | 67% | 53% | 39% | 25% | 11% | 0% |
| Luminous Flux Ratio W2 | 0% | 14% | 26% | 39% | 52% | 68% | 85% | 100% |
| Luminous Flux Ratio G | 0% | 3% | 7% | 8% | 9% | 7% | 4% | 0% |
| CIE X | 0.3125 | 0.3288 | 0.3442 | 0.3612 | 0.3826 | 0.4077 | 0.4348 | 0.4579 |
| CIE Y | 0.3287 | 0.3412 | 0.3550 | 0.3662 | 0.3801 | 0.3918 | 0.4030 | 0.4104 |
| CRI | 83 | 83 | 84 | 85 | 87 | 87 | 86 | 84 |
| R9 | 7.2 | 7.2 | 12.6 | 20.3 | 24.0 | 23.6 | 18.9 | 12.2 |

As shown in the Table 1, when the luminous flux ratio of the first white light, the luminous flux ratio of the second white light, and the luminous flux ratio of the green light are indicated as W1, W2 and G, respectively, W1+W2+G=100%, and each of W1 and W2 may be complementarily changed within a range of 0 to 100%. In such a variation section, the luminous flux ratio G of the green light may be changed within a range of 0 to 10%.

A color temperature of finally emitted white light may be changed within a color temperature section of 2700K to 6500K. In addition, over the color temperature variation section, the color rendering index (CRI) of white light may be 80 or more, relatively high, and the relatively high color rendering index (CRI) may be stably maintained.

In particular, in a central region of the color temperature variation section, for example, in a section of 3500K to 5000K, since a distance deviating from the black body locus (BBL) is large, the luminous flux ratio G of the green light may be adjusted to be 7% or more, relatively high. In such a central region, it can be confirmed that a relatively high color rendering index (CRI) is generally shown.

Figure 4:
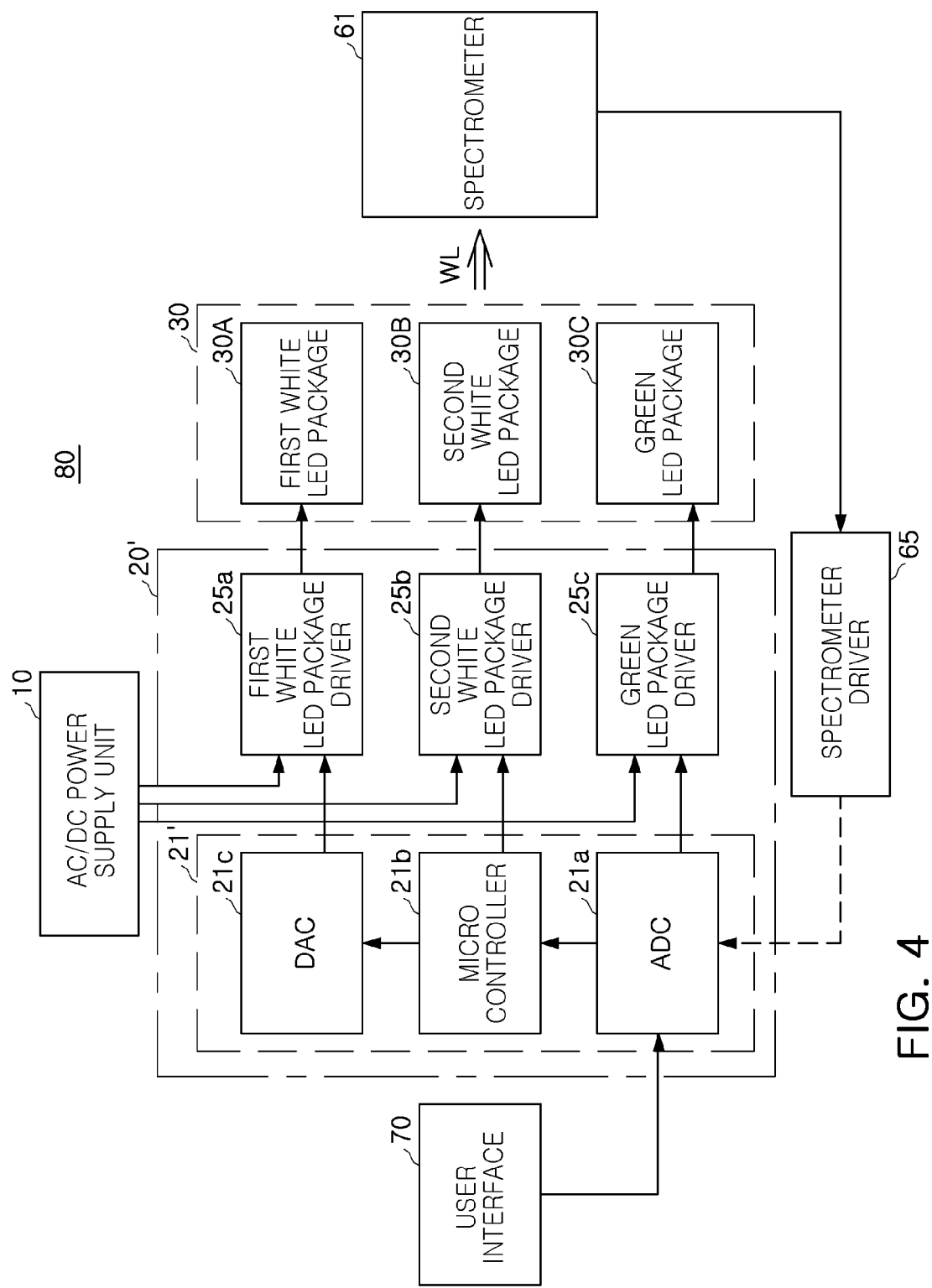
FIG. 4 is a block diagram illustrating main constitutions of an LED lighting apparatus according to another example exemplary implementation.

FIG. 4 is a block diagram illustrating main constitutions of an LED lighting apparatus according to another exemplary implementation. An LED lighting apparatus 80 illustrated in FIG. 4 is different from the embodiment 50 illustrated in FIG. 1 in terms of using a light detector 61 such as a spectrometer in controlling white light characteristics.

As shown in FIG. 4, the LED lighting apparatus 80 may include the white light emitting modules 20' and 30 and the power supply unit 10 supplying power to the white light emitting modules. The white light emitting module 20' may include driving controller 21'. Unless other descriptions are specified, components employed in this embodiment may be understood to be identical to or similar to the components described in the foregoing embodiment.

The driving controller 21' provides a driving signal for individually controlling three first and second white LED package drivers 25a and 25b and the green LED package driver 25c. The driving controller 21' includes an analogue to digital converter (ADC) 21a, a micro-controller 21b, and a digital to analogue converter (DAC) 21c.

The exemplary implementation may further include a light detector 61 detecting and analyzing finally emitted white light WL. For example, the light detector 61 may be a spectrometer. The light detector 61 may obtain information such as a color temperature, a color rendering index, or R9 of the finally emitted white light WL. The information may be transferred from a detection information driver 65 to the analogue to digital converter ADC 21a, as an analogue signal. The ADC 21a may convert the analog signal into a digital signal and may transmit the digital signal to the micro-controller 21b. When the light detector 61 is a spectrometer, the detection information driver 65 may be a spectrometer driver.

A desired color temperature may be input to the analogue to digital converter ADC 21a through a user interface 70, and information input together with currently measured information may be input to the micro-controller 21b. The micro-controller 21b may compute variations in luminous flux of the respective LED packages 30A, 30B, and 30C, based on a difference between the desired color temperature and a currently detected color temperature and may transmit driving signals according to the computed variations in luminous flux to the respective LED package drivers 25a, 25b and 25c through the digital to analogue converter (DAC) 21c, thereby driving the respective LED packages 30A, 30B, and 30C at a desired level of luminous flux.

Meanwhile, in a case in which a deviation in a color temperature of actual white light according to a previously input color temperature and a previously input signal is present, the micro-controller 21b may compensate for a computing program of a driving signal for controlling levels of luminous flux of the respective LED packages 30A, 30B, and 30C so as to reduce deviations.

Figure 5:
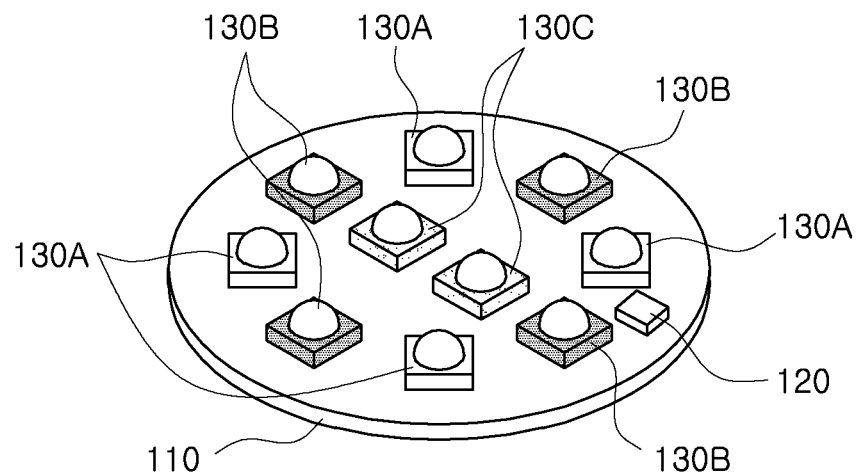
FIG. 5 is a schematic perspective view illustrating an example of a white light emitting module employable in the LED lighting apparatus according to an example exemplary implementation.

FIG. 5 is a schematic perspective view illustrating an example of a white light emitting module employable in the LED lighting apparatus according to an example embodiment of the present inventive concept.

As shown in FIG. 5, a white light emitting module 150 according to an exemplary implementation may include four first white LED packages 130A, four second white LED packages 130B, two green LED packages 130C, and a driving control chip 120, mounted on a substrate 110 having a circular shape.

Figure 6:
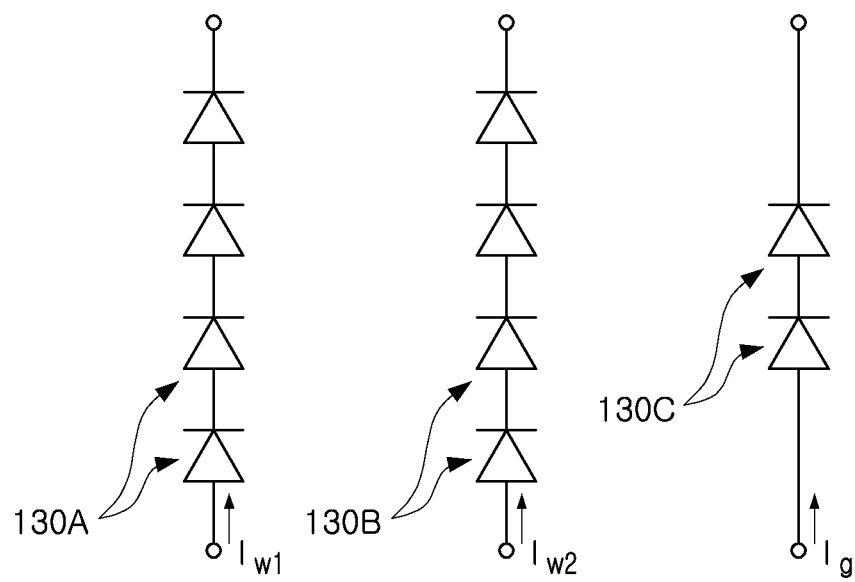
FIG. 6 is a schematic view illustrating circuits of respective groups of LED packages employed in the white light emitting module of FIG. 5.

In the example exemplary implementation, the four first white LED packages 130A may be provided as an LED array emitting cool white light while the four second white LED packages 130B may be provided as an LED array emitting warm white light. As illustrated in FIG. 6, by circuit patterns implemented on the substrate 110, each of the four first white LED packages 130A and the four second white LED packages 130B may be connected to each other in series and may be independently driven by currents $I_{w1}$ and $I_{w2}$ provided from the respective drivers (for example, 25a and 25b of FIG. 1). Similar to this, the two green LED packages 130C may also be driven by a current $I_g$ provided from an independent driver (for example, 25c of FIG. 1). In this manner, arrays of the respective LED packages 130A, 130B and 130C may be independently driven and may emit light with different levels of luminous flux.

The first white LED package 130A and the second white LED package 130B and the green LED packages 130C may be disposed to be bisymmetrical to each other or rotationally symmetrical to each other in order to provide uniform light distribution. As illustrated in FIG. 5, the first white LED package 130A and the second white LED package 130B configuring white light may be arranged at constant intervals along the circumference of the substrate 110, and may be alternately arranged. Meanwhile, the two green LED packages 130C may be disposed in parallel to each other in the center of the substrate 110. Through the symmetric disposition, even in the case of variations in luminous flux ratio, desired white light may be provided by uniform color mixture.

Even in a case in which the first white LED package 130A and the second white LED package 130B are within the same group, they may not have the same color coordinates. Practically, even in the case of packages fabricated to emit light having the same color coordinates, the packages may emit white light having different color coordinates due to a fabrication error. In this manner, white LED packages having different color characteristics (for example, a peak wavelength and an output) may be binned according to a plurality of color coordinate regions, and the binned LED packages may be appropriately combined, whereby an array of white LED packages emitting white light having desired color coordinates may be fabricated.

Figure 7:
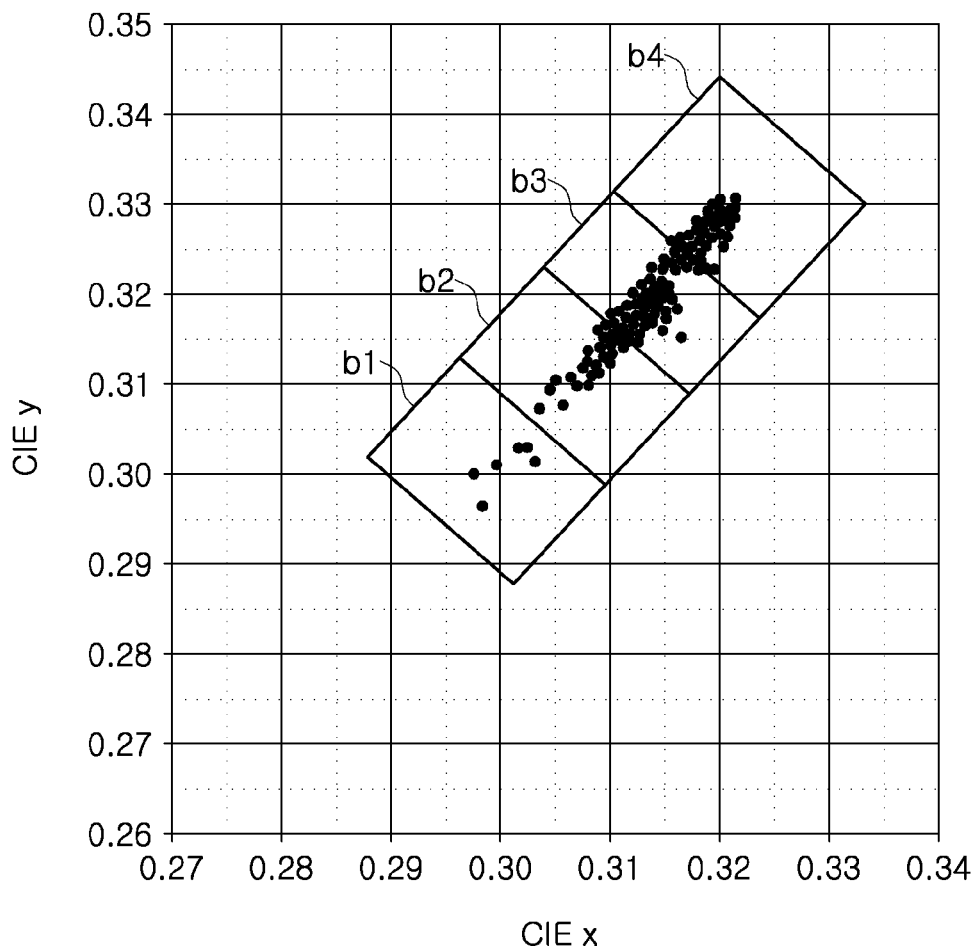
FIG. 7 is the CIE 1931 chromaticity diagram illustrating an example of a binning process for configuring the first white LED package and the second white LED package.

For example, in the case of the first white LED packages 130A, color coordinates of a plurality of white LED packages fabricated as the first white LED packages 130A may be measured and may be classified as four bins b1, b2, b3, and b4 illustrated in FIG. 7. In order to satisfy color coordinate conditions required in respective binning groups, a combination of the first white LED packages 130A placed in different bins may be selected. Through the binning operation and the combining operation, white LED packages deviating from a desired, target color coordinate region may also be utilized.

The example exemplary implementation illustrates a case in which the LED packages are provided in a specific arrangement, but the LED packages may be provided in other arrangements such as a linear arrangement and a matrix arrangement. In addition, the substrate 110 may be exemplified to have a circular shape, but it may be variously shaped according to a structure of a lighting apparatus.

In the light emitting module according to the aforementioned embodiment, LED packages formed in various manners may be used. In particular, the first white LED package and the second white LED package may be provided as variously shaped packages in which a wavelength conversion material such as a phosphor and a semiconductor light emitting diode chip are combined.

Figure 8:
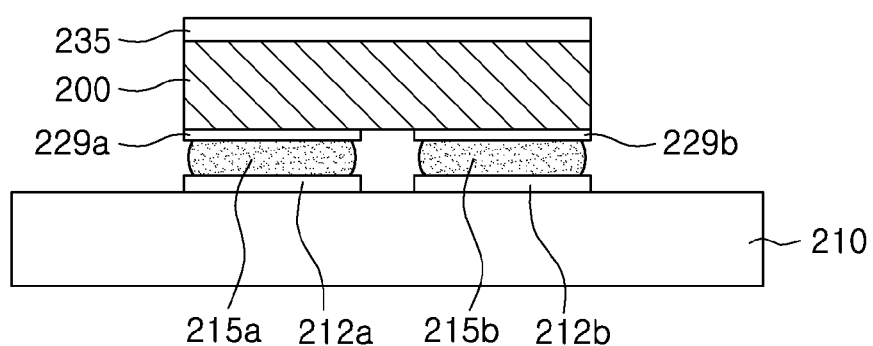
FIG. 8 is a side cross-sectional view illustrating an example of a white LED package employable in a white light emitting module according to an example exemplary implementation.

FIG. 8 is a side cross-sectional view illustrating an example of a white LED package employable in a white light emitting module according to an example embodiment of the present inventive concept.

As shown in FIG. 8, a white LED package 230 according to an exemplary implementation may include a package substrate 210 having a mounting surface, and a semiconductor light emitting diode chip 200 flip-chip bonded on the mounting surface of the package substrate 210.

A wavelength conversion film 235 may be disposed on an upper surface of the semiconductor light emitting diode chip 200 mounted on the package substrate 210. The wavelength conversion film 235 may include wavelength conversion materials converting a wavelength of a portion of light emitted by the semiconductor light emitting diode chip 200 into another wavelength. The wavelength conversion film 235 may be a resin layer in which the wavelength conversion materials are dispersed, or may be a ceramic film formed of a sintered body of ceramic phosphors. The semiconductor light emitting diode chip 200 may emit blue light, and the wavelength conversion film 235 may convert a portion of the blue light into yellow and/or red and green, whereby a semiconductor light emitting device 30 emitting white light may be provided. The wavelength conversion materials usable in the embodiment will be described later (with reference to the following Table 2).

Figure 9:
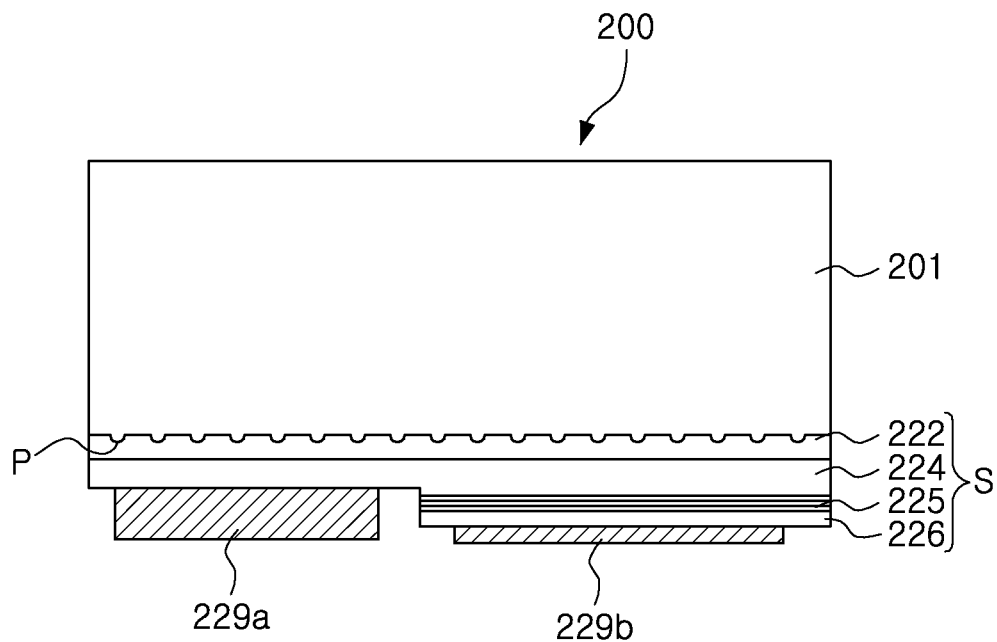
FIG. 9 is a side cross-sectional view of an LED chip employable in the white LED package illustrated in FIG. 8.

As illustrated in FIG. 9, the semiconductor light emitting diode chip 200 employable in the white LED package 230 may include a substrate 201 and a first conductivity-type semiconductor layer 224, an active layer 225, and a second conductivity-type semiconductor layer 226 sequentially disposed on the substrate 201. A buffer layer 222 may be disposed between the substrate 201 and the first conductivity-type semiconductor layer 224.

The substrate 201 may be an insulating substrate such as sapphire. However, the substrate 201 is not limited thereto and alternatively, may be a conductive substrate or semiconductor substrate, in addition to the insulating substrate. For example, the substrate 201 may be formed of SiC, Si, $MgAl_2O_4$, MgO, $LiAlO_2$, $LiGaO_2$, or GaN, in addition to sapphire. An unevenness structure P may be formed on the upper surface of the substrate 201. The unevenness structure P may improve light extraction efficiency and may enhance the quality of a grown single-crystal.

The buffer layer 222 may be $In_xAl_yGa_{1-x-y}N$ ($0 \leq x \leq 1$, $0 \leq y \leq 1$, $0 \leq x+y \leq 1$). For example, the buffer layer 222 may be GaN, AlN, AlGaN, or InGaN. If necessary, a combination of a plurality of layers or layers formed by gradually changing a composition may also be used for the material of the buffer layer 222.

The first conductivity-type semiconductor layer 224 may be a nitride semiconductor satisfying n-type $In_xAl_yGa_{1-x-y}N$ ($0 \leq x < 1$, $0 \leq y < 1$, $0 \leq x+y < 1$), and an n-type dopant may be silicon (Si). For example, the first conductivity-type semiconductor layer 224 may contain n-type GaN. The second conductivity-type semiconductor layer 226 may be a nitride semiconductor layer satisfying p-type $In_xAl_yGa_{1-x-y}N$ ($0 \leq x < 1$, $0 \leq y < 1$, $0 \leq x+y < 1$), and a p-type dopant may be magnesium (Mg). For example, the second conductivity-type semiconductor layer 226 may be implemented as a single layer structure, but as in the example, may have a multilayer structure having different compositions. The active layer 225 may have a multiple quantum well (MQW) structure in which quantum well layers and quantum barrier layers are alternately stacked. For example, the quantum well and quantum barrier layers may be different compositions of $In_xAl_yGa_{1-x-y}N$ (0≤x≤1, 0≤y≤1, 0≤x+y≤1). In a certain embodiment, the quantum well layer may be $In_xGa_{1-x}N$ (0<x≤1) and the quantum barrier layer may be GaN or AlGaN. A thickness of each of the quantum well and quantum barrier layers may range from about 1 nm to 50 nm. The structure of the active layer 225 is not limited to the multiple quantum well (MQW) structure and may also be a single quantum well (SQW) structure.

First and second electrodes 229a and 229b may be disposed on a mesa-etched region of the first conductivity-type semiconductor layer 224 and the second conductivity-type semiconductor layer 226, respectively, in such a manner that they are positioned on the same face. The first electrode 229 is not limited to but may contain a material such as Ag, Ni, Al, Cr, Rh, Pd, Ir, Ru, Mg, Zn, Pt, Au or the like, and may have a structure of a single layer or two or more layers. If necessary, the second electrode 229b may be a transparent electrode such as a transparent conductive oxide or nitride or may contain graphene. The second electrode 229b may contain at least one of Al, Au, Cr, Ni, Ti, and Sn.

Figure 10:
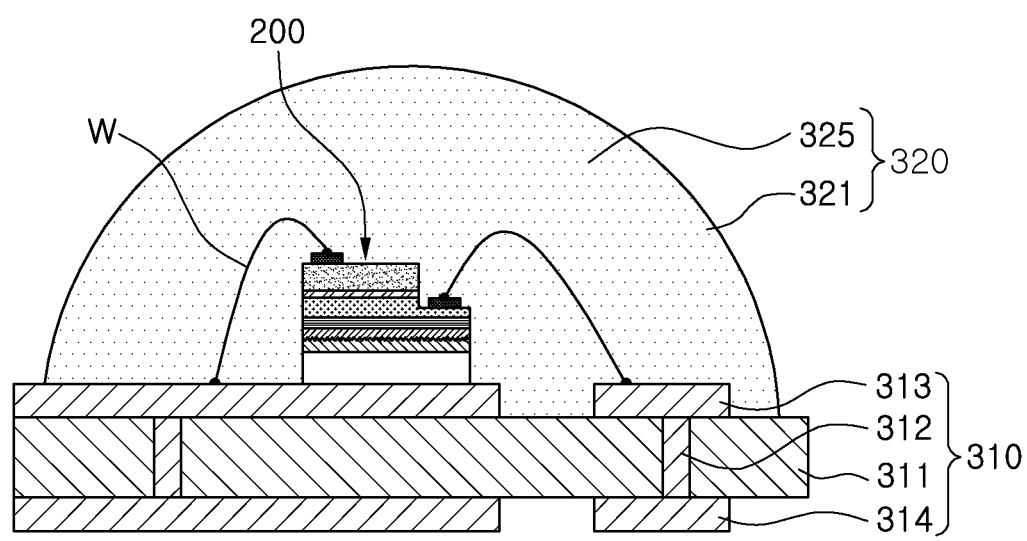
FIG. 10 is a cross-sectional view illustrating another example of a white LED package employable in an example exemplary implementation.

FIG. 10 is a cross-sectional view illustrating another example of a white LED package employable in an example embodiment of the present inventive concept.

A white LED package 330 illustrated in FIG. 10 may include the semiconductor light emitting diode chip 200 illustrated in FIG. 9, a mounting substrate 310, and an encapsulating part 320. The semiconductor light emitting diode chip 200 may be mounted on the mounting substrate 310 and be electrically connected thereto through a wire W. The mounting substrate 310 may include a substrate body 311, an upper electrode 313, a lower electrode 314, and a through electrode 312 connecting the upper electrode 313 and the lower electrode 314. The mounting substrate 310 may be provided as a board such as PCB, MCPCB, MPCB, FPCB or the like and a structure thereof may be used in various manners.

The encapsulating part 320 may have a convex lens shape in which an upper surface thereof is upwardly convex, but may have another shape according to other exemplary implementations, whereby an orientation angle of light emitted by the structure of the encapsulating part 320 may be controlled.

The encapsulating part 320 may contain wavelength conversion materials 321 such as phosphors and/or quantum dots. As the wavelength conversion materials, various materials such as phosphors and/or quantum dots may be used.

Figure 11:
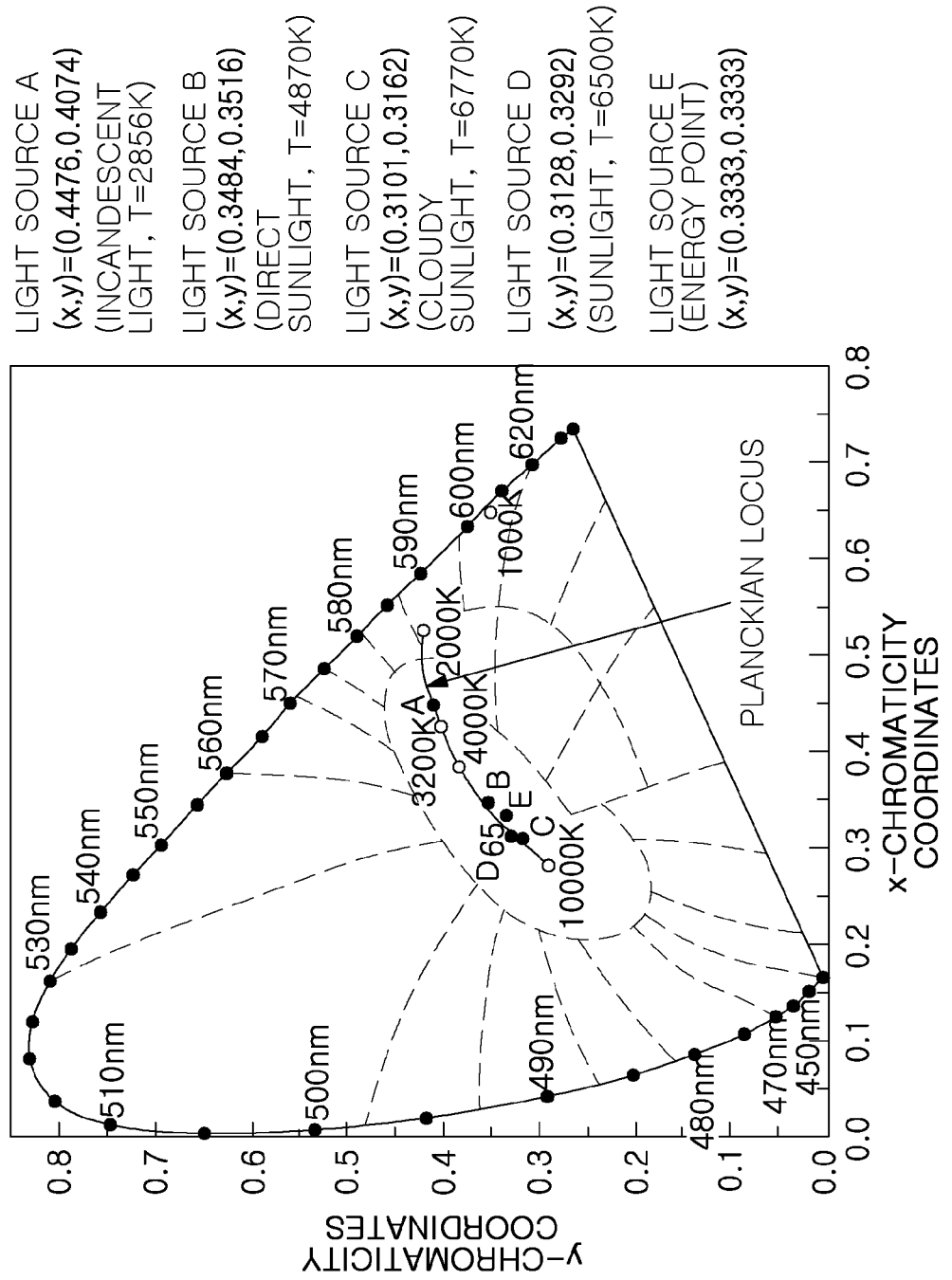
FIG. 11 is the CIE 1931 chromaticity diagram illustrating a wavelength conversion material employable in the white LED package according to an example exemplary implementation.

FIG. 11 is the CIE 1931 chromaticity diagram illustrating a wavelength conversion material employable in the white LED package according to an example exemplary implementation.

A color of light emitted by the LED package may be controlled depending on a wavelength and type of an LED chip and a mixing ratio of wavelength conversion materials. In the case of the white LED package, a color temperature and a color rendering index thereof may be controlled.

For example, a semiconductor diode chip emitting ultraviolet or blue light may implement white light by combining appropriate phosphors from yellow, green, red and blue phosphors and may emit white light having various color temperatures according to a mixing ratio of the selected phosphors.

A lighting apparatus may adjust a color rendering index (CRI) from a level of light emitted by a sodium halide lamp to the level of sunlight, and may generate various types of white light with color temperatures ranging from 1500K to 20000K. Also, if necessary, the lighting apparatus may generate violet, blue, green, red or orange light or infrared light to adjust the color of light according to a surrounding atmosphere and a user mood. Also, the lighting apparatus may generate a specific wavelength of light for accelerating the growth of plants.

White light formed by combining yellow, green, red phosphors with a blue semiconductor diode chip and/or combining green and red light emitting devices may have two or more peak wavelengths, and coordinates (x, y) thereof in the CIE 1931 chromaticity diagram of FIG. 11 may be positioned within a region of a line segment connecting (0.4476, 0.4074), (0.3484, 0.3516), (0.3101, 0.3162), (0.3128, 0.3292), and (0.3333, 0.3333). Alternatively, coordinates (x, y) thereof in the CIE 1931 chromaticity diagram may be positioned in a region surrounded by the line segment and a black body locus. The color temperature of white light may range from 1500K to 20000K. In FIG. 11, white light in the vicinity of point E (0.3333, 0.3333), disposed below the black body locus, may be in a state in which a level of yellow light is relatively low and may be used as a lighting light source in a region exhibiting a brighter or fresh feeling to the naked eye. Therefore, lighting products using white light in the vicinity of point E (0.3333, 0.3333), disposed below the black body locus, may be highly effective as lighting apparatuses for retail spaces offering groceries, clothes and the like for sale.

Phosphors usable in the present inventive concept may have the following composition formulae and colors.

Oxides may be: Yellow and green $Y_3Al_5O_{12}$:Ce, $Tb_3Al_5O_{12}$:Ce, $Lu_3Al_5O_{12}$:Ce.

Silicates may be: Yellow and green $(Ba,Sr)_2SiO_4$:Eu, yellow and orange $(Ba,Sr)_3SiO_5$:Ce.

Nitrides may be: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$: Eu, $Ln_{4-x}(Eu_zM_{1-z})_xSi_{12-y}Al_yO_{3+x+y}N_{18-x-y}$ ((0.5≤x≤3, 0<z<0.3, 0<y≤4)—Equation (1)).

In Equation (1), Ln may be at least one type of element selected from the group consisting of Group IIIa elements and rare earth elements, and M may be at least one type of element selected from the group consisting of calcium (Ca), barium (Ba), strontium (Sr), and magnesium (Mg).

Fluorides may be: $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$.

Phosphor compositions should basically conform with stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La) based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone or with a co-activator for modifying characteristics of phosphors.

The following Table 2 shows types of phosphors according to application fields of white light emitting devices using a UV or blue LED chip.

TABLE 2

| USAGE | Phosphor |
|---|---|
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, |

TABLE 2-continued

| USAGE | Phosphor |
|---|---|
| Lighting Apparatuses | $SrLiAl_3N_4:Eu$, $Ln_{4-x}(Eu_zM_{1-z})_xSi_{12-y}Al_yO_{3+x+y}N_{18-x-y}$ $(0.5 \leq x \leq 3, 0 < z < 0.3,$ $0 < y \leq 4)$, $K_2TiF_6:Mn^{4+}$, $NaYF_4:Mn^{4+}$, $NaGdF_4:Mn^{4+}$ $Ca_2SiO_4:Eu$, $Ca_{1.2}Eu_{0.8}SiO_4$ $Lu_3Al_5O_{12}:Ce^{3+}$, $Ca-\alpha-SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ $(0.5 \leq x \leq 3, 0 < z < 0.3,$ $0 < y \leq 4)$, $K_2TiF_6:Mn^{4+}$, $NaYF_4:Mn^{4+}$, |
| Side Viewing (Mobile Devices, Laptop PCs) Electronic Apparatuses (Headlamps, etc.) | $Lu_3Al_5O_{12}:Ce^{3+}$, $Ca-\alpha-SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $(Sr, Ba, Ca, Mg)_2SiO_4:Eu^{2+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ $Lu_3Al_5O_{12}:Ce^{3+}$, $Ca-\alpha-SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ $(0.5 \leq x \leq 3, 0 < z < 0.3,$ |

Further, as the wavelength conversion material, a material for substituting for the phosphor, a material such as a quantum dot (QD) or the like may be used.

The quantum dots may realize various colors according to sizes and, in particular, when the quantum dot is used as a phosphor substitute, it may be used as a red or green phosphor. The use of a quantum dot may allow a narrow FWHM (e.g., about 35 nm) to be realized.

The wavelength conversion material may be provided in the form of being contained in an encapsulator, or alternatively, the wavelength conversion material may be manufactured as a film in advance and attached to a surface of an optical device such as a light guide plate or a semiconductor light emitting device. In the case of using the wavelength conversion material manufactured as a film in advance, a wavelength conversion material having a uniform thickness may be easily implemented.

The LED module according to the embodiment may be advantageously used in lighting apparatuses having various forms.

Figure 12:
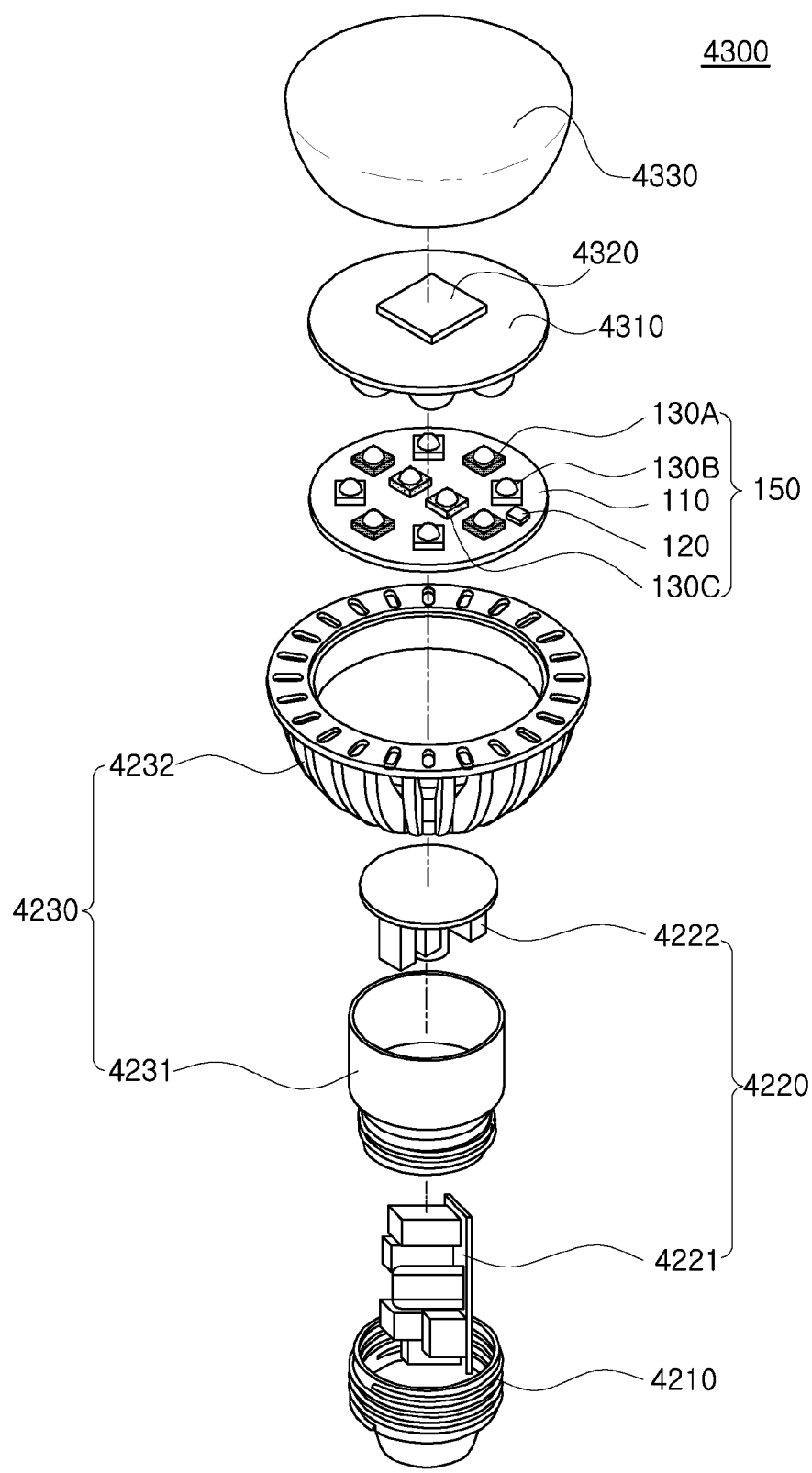
FIG. 12 is an exploded perspective view illustrating a bulb type lighting apparatus employing the white light emitting module illustrated in FIG. 5, as an example of a lighting apparatus according to an example exemplary implementation.

FIG. 12 is an exploded perspective view illustrating a bulb type lighting apparatus employing the white light emitting module illustrated in FIG. 5, as an example of a lighting apparatus according to an example exemplary implementation.

As shown in FIG. 12, a lighting apparatus 4300 may include a housing configured of a plurality of assemblies, the white light emitting module 150, and a power supply unit 4220. The housing of the lighting apparatus 4300 may include a screw base 4210 and a heat sink 4230.

In the example exemplary implementation, the white light emitting module 150 may include the substrate 110, and the LED arrays and the driving control chip 120 arranged on the substrate 110. The LED arrays may have a symmetrical arrangement structure including four first white LED packages 130A, four second white LED packages 130B, and two green LED packages 130C. The driving control chip 120 may have functions corresponding to those of the driving controller of FIG. 1 and FIG. 4 and may store driving information on the LED arrays.

The screw-base 4210 may be configured to mate with existing light fixtures and thereby replace existing light bulbs, such as incandescent light bulbs. Power supplied to the lighting apparatus 4200 may be applied through the screw-base 4210. The power supply unit 4220 may include an AC/DC power source. The white light emitting module 150 may receive power from the power supply unit 4220 and may emit light to reflective plate 4310|[CC1]. As illustrated in the embodiment, the power supply unit 4220 may include a first power source unit 4221 and a second power source unit 4222. The first power source unit 4221 and the second power source unit 4222 may be assembled to form the power supply unit 4220. The heat sink 4230 may include an internal heat sink 4231 and an external heat sink 4232. The internal heat sink 4231 may be directly connected to the white light emitting module 150 and/or the power supply unit 4220 to thereby transmit heat to the external heat sink 4232.

A reflective plate 4310 is provided above the light source module 4240, and here, the reflective plate 4310 serves to allow light from the light source to spread evenly toward the lateral and rear sides thereof, and thereby glare may be reduced. In addition, a communications module 4320 may be mounted on an upper portion of the reflective plate 4310, and home network communication may be realized through the communications module 4320. For example, the communications module 4320 may be a wireless communications module using ZigBee®, Wi-Fi, or light fidelity (Li-Fi), and may control lighting installed within or outside of a household, such as turning on or off a lighting apparatus, adjusting brightness of a lighting apparatus, and the like, via a smartphone or a wireless controller. Also, home appliances or an automobile system within or outside of a household, such as a TV, a refrigerator, an air-conditioner, a door lock, or automobiles, and the like, may be controlled through a Li-Fi communications module using visible wavelengths of the lighting apparatus installed within or outside of the household. The reflective plate 4310 and the communications module 4320 may be covered by a cover unit 4330.

Figure 13:
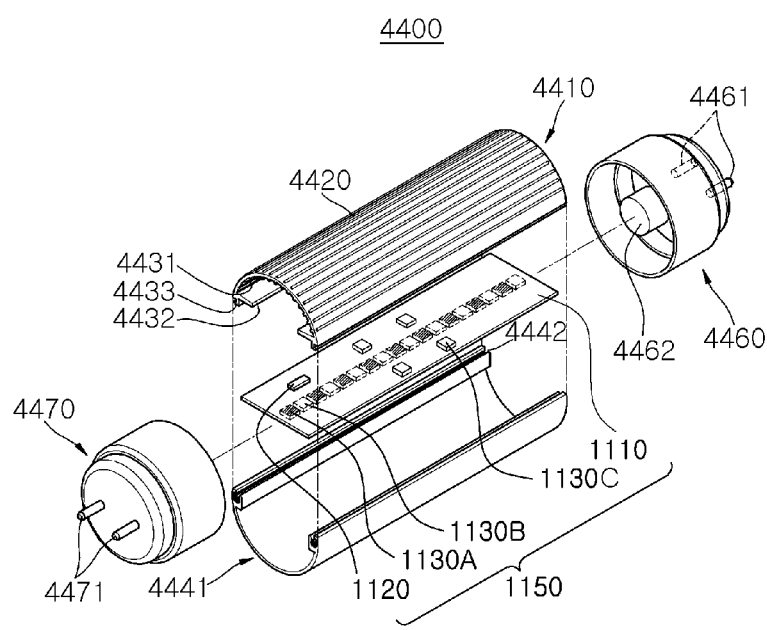
FIG. 13 is an exploded perspective view illustrating a tube type lighting apparatus according to an example exemplary implementation.

FIG. 13 is an exploded perspective view illustrating a tube type lighting apparatus according to an example embodiment of the present inventive concept.

A lighting apparatus 4400 illustrated in FIG. 13 may include a housing configured of various assemblies and the white light emitting module 1150. The housing may include a heat sink 4410, a cover 4441, a first pin base 4460, and a second pin base 4470. Stoppage protrusions 4433 may be formed on both ends of the heat sink 4410. A plurality of heat sink fins 4420 and 4431 may be formed in a concavo-convex pattern on an internal and/or external surface of the heat sink 4410, and the heat sink fins 4420 and 4431 may be designed to have various shapes and intervals (spaces) therebetween. A support 4432 having a protruded shape may be formed on an inner side of the heat sink 4410.

The stoppage recesses 4442 may be formed in the cover 4441, and the stoppage protrusions 4433 of the heat sink 4410 may be coupled to the stoppage recesses 4442. The positions of the stoppage recesses 4442 and the stoppage protrusions 4433 may be interchanged.

The white light emitting module 1150 may include an LED array. The white light emitting module 1150 may include a circuit board 1110, LED arrays 1130A, 1130B and 1130C, and a driving control chip 1120. The LED arrays may have a bisymmetrical arrangement and may include first and second white LED packages 1130A and 1130B alternately arranged in a row and green LED packages 1130C arranged on a two-by-two basis on both sides of the first white LED package and the second white LED package. As described above, the driving control chip 1120 may perform functions of the driving controller described with reference to FIG. 1 and FIG. 4 and may store driving information on the LED package array 1130A, 1130B and 1130C. Circuit wirings are formed on the circuit board 1110 to operate the LED package array 1130A, 1130B and 1130C.

The first and second sockets 4460 and 4470, a pair of sockets, are respectively coupled to opposing ends of the cylindrical cover unit including the heat sink 4410 and the cover 4441. For example, the first pin base 4460 may include electrode terminals 4461 and a power source device 4462, and dummy terminals 4471 may be disposed on the second pin base 4470. Also, an optical sensor and/or a communications module may be installed in either the first pin base 4460 or the second pin base 4470. For example, the optical sensor and/or the communications module may be installed in the second pin base 4470 in which the dummy terminals 4471 are disposed. In another example, the optical sensor and/or the communications module may be installed in the first pin base 4460 in which the electrode terminals 4461 are disposed.

Figure 14:
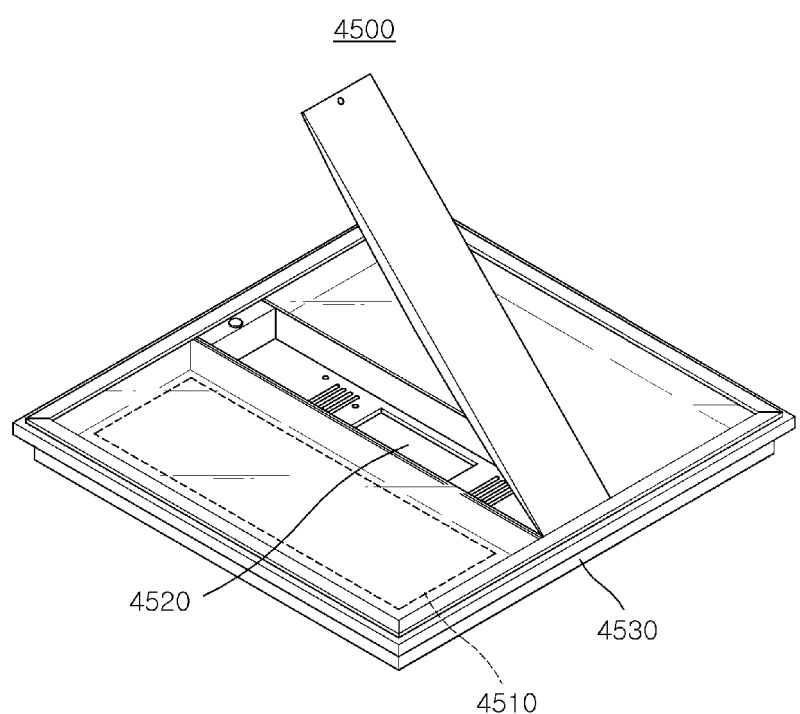
FIG. 14 is a schematic perspective view illustrating a flat lighting apparatus according to an example exemplary implementation.

FIG. 14 is a schematic perspective view illustrating a flat lighting apparatus according to an example embodiment of the present inventive concept.

As shown in FIG. 14, a flat lighting apparatus 4500 may include a white light emitting module 4510, a power supply unit 4520, and a housing 4530. According to the example embodiment, the light emitting module 4510 may include an LED package array similar to the foregoing embodiment. The power supply unit 4520 may include an AC/DC power source. The white light emitting module 4510 may be formed to have an overall planar shape such that it corresponds to a structure of a lighting apparatus. According to the embodiment, the white light emitting module 4510 may include a light emitting diode and a driving controller storing driving information of the light emitting diode.

The power supply unit 4520 may be configured to supply power to the white light emitting module 4510. The housing 4530 may have an accommodation space accommodating the white light emitting module 4510 and the power supply unit 4520 therein and have a hexahedral shape with one open side, but the shape of the housing 4530 is not limited thereto. The white light emitting module 4510 may be disposed to emit light to the open side of the housing 4530.

Figure 15:
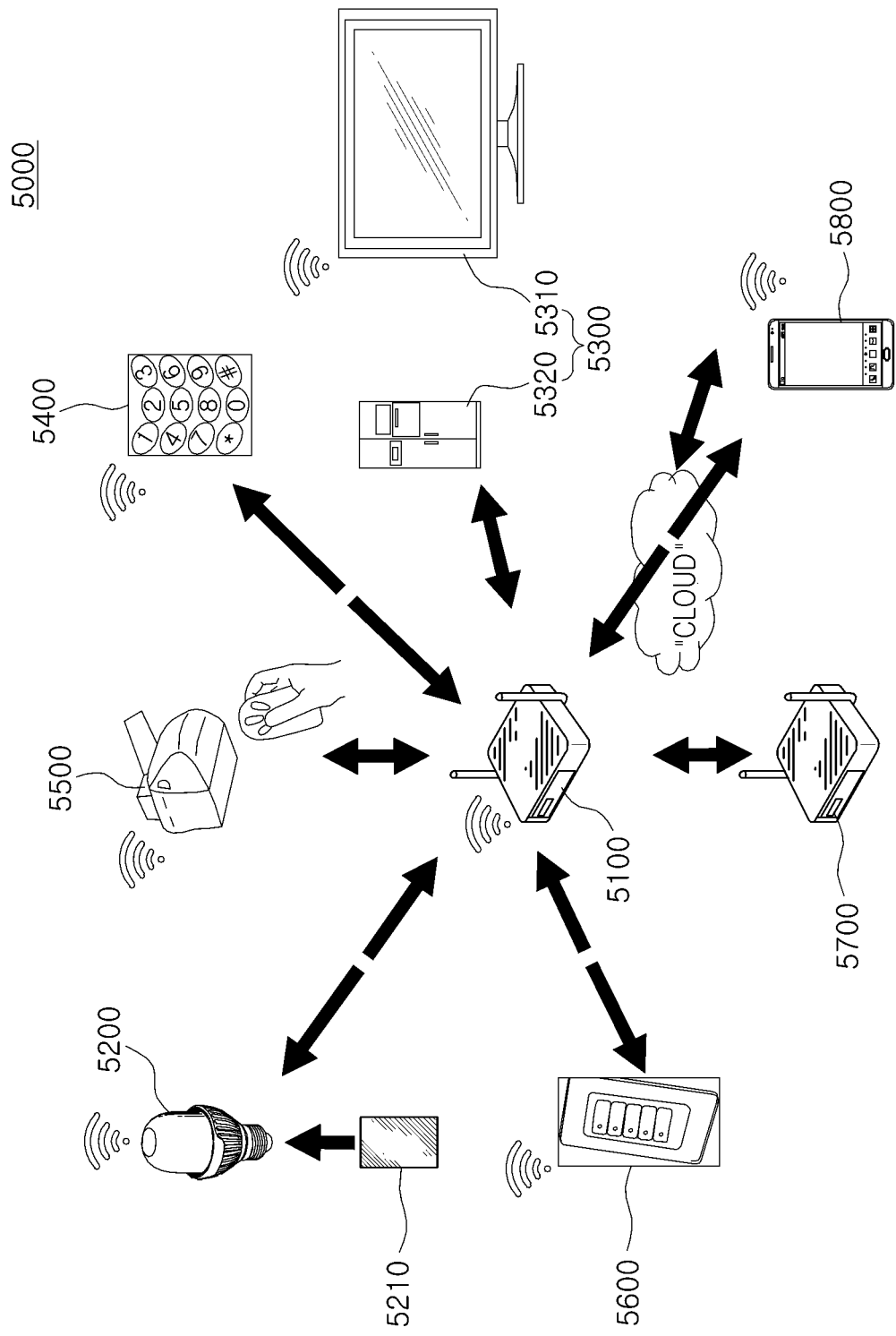
FIG. 15 is a schematic view illustrating an example exemplary implementation of an indoor lighting control network system.

FIG. 15 is a schematic view illustrating an indoor lighting control network system.

A network system 5000 according to the embodiment may be a complex smart lighting-network system combining lighting technology using a light emitting device such as an LED, or the like, Internet of Things (IoT) technology, wireless communications technology, and the like. The network system 5000 may be realized using various lighting apparatuses and wired/wireless communications devices, and may be realized by a sensor, a controller, a communications unit, software for network control and maintenance, and the like.

The network system 5000 may be applied even to an open space such as a park or a street, as well as to a closed space such as a home or an office. The network system 5000 may be realized on the basis of the IoT environment in order to collect and process a range of information and provide the same to users. Here, an LED lighting apparatus 5200 included in the network system 5000 may not only serve to receive information regarding a surrounding environment from a gateway 5100 and control lighting of the LED lighting apparatus 5200 itself, but also to check and control operational states of other devices 5300 to 5800 included in the IoT environment on the basis of a function such as visible light communications, or the like, of the LED lighting apparatus 5200.

As shown in FIG. 15, the network system 5000 may include the gateway 5100 processing data transmitted and received according to different communications protocols, the LED lighting apparatus 5200 connected to be available for communicating with the gateway 5100 and including an LED light emitting device, and a plurality of devices 5300 to 5800 connected to be available for communicating with the gateway 5100 according to various wireless communications schemes. In order to realize the network system 5000 on the basis of the IoT environment, each of the devices 5300 to 5800, as well as the LED lighting apparatus 5200, may include at least one communications module. In an example embodiment, the LED lighting apparatus 5200 may be connected to be available for communicating with the gateway 5100 according to wireless communication protocols such as Wi-Fi, ZigBee®, or Li-Fi, and to this end, the LED lighting apparatus 5200 may include at least one communications module 5210 for a lamp.

As mentioned above, the network system 5000 may be applied even to an open space such as a park or a street, as well as to a closed space such as a home or an office. When the network system 5000 is applied to a home, the plurality of devices 5300 to 5800 included in the network system and connected to be available for communicating with the gateway 5100 on the basis of the IoT technology may include a home appliance 5300 such as a TV 5310 or a refrigerator 5320, a digital door lock 5400, a garage door lock 5500, a light switch 5600 installed on a wall, or the like, a router 5700 for relaying a wireless communication network, and a mobile device 5800 such as a smartphone, a tablet PC, or a laptop computer.

In the network system 5000, the LED lighting apparatus 5200 may check operational states of various devices 5300 to 5800 using the wireless communications network (ZigBee®, Wi-Fi, Li-Fi, etc.) installed in a household or automatically control illumination of the LED lighting apparatus 5200 itself according to a surrounding environment or situation. Also, the devices 5300 to 5800 included in the network system 5000 may be controlled using Li-Fi communications using visible light emitted by the LED lighting apparatus 5200.

First, the LED lighting apparatus 5200 may automatically adjust illumination of the LED lighting apparatus 5200 on the basis of information of a surrounding environment transmitted from the gateway 5100 through the communications module 5210 for a lamp or information of a surrounding environment collected from a sensor installed in the LED lighting apparatus 5200. For example, brightness of illumination of the LED lighting apparatus 5200 may be automatically adjusted according to types of programs broadcast on the TV 5310 or brightness of a screen. To this end, the LED lighting apparatus 5200 may receive operation information of the TV 5310 from the communications module 5210 for a lamp connected to the gateway 5100. The communications module 5210 for a lamp may be integrally modularized with a sensor and/or a controller included in the LED lighting apparatus 5200.

For example, when a TV program is a drama, a color temperature of illumination may be decreased to be 12000K or lower, for example, to 5000K, and a color tone may be adjusted according to preset values, and thereby a cozy atmosphere may be formed. Conversely, when a program value is a comedy program, the network system 5000 may be configured so that a color temperature of illumination is increased to 5000K or higher according to a preset value, and illumination is adjusted to white illumination based on a blue color.

Also, when no one is at home, and a predetermined time has lapsed after the digital door lock 5400 is locked, all of the turned-on LED apparatuses 5200 are turned off to prevent a waste of electricity. Also, when a security mode is set through the mobile device 5800, or the like, and the digital door lock 5400 is locked with no one at home, the LED lighting apparatus 5200 may be maintained in a turned-on state.

An operation of the LED lighting apparatus 5200 may be controlled according to surrounding environments collected through various sensors connected to the network system 5000. For example, when the network system 5000 is realized in a building, a lighting, a position sensor, and a communications module are combined in the building, and position information of people in the building is collected and the lighting is turned on or turned off, or the collected information may be provided in real time to effectively manage facilities or effectively utilize idle space. In general, a lighting apparatus such as the LED lighting apparatus 5200 is disposed in almost every space of each floor of a building, and thus, various types of information of the building may be collected through a sensor integrally provided with the LED lighting apparatus 5200 and used for managing facilities and utilizing idle space.

Meanwhile, the LED lighting apparatus 5200 may be combined with an image sensor, a storage device, and the communications module 5210 for a lamp, to be utilized as a device for maintaining building security, or sensing and coping with an emergency situation. For example, when a smoke or temperature sensor, or the like, is attached to the LED lighting apparatus 5200, a fire may be promptly sensed to minimize damage. Also, brightness of lighting may be adjusted in consideration of external weather or an amount of sunlight, thereby saving energy and providing an agreeable illumination environment.

Figure 16:
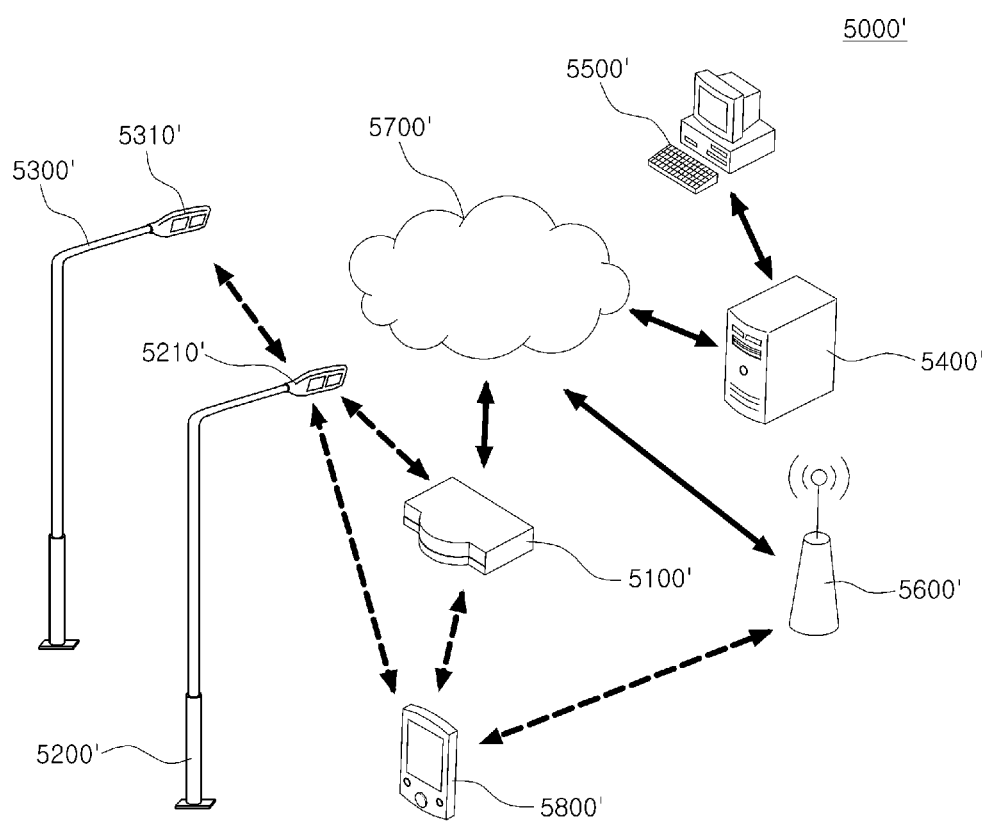
FIG. 16 is a view illustrating an example exemplary implementation of a network system applied to an open space.

FIG. 16 is a view illustrating an example of a network system applied to an open space.

Referring to FIG. 16, a network system 5000' according to the present example embodiment may include a communications connection device 5100', a plurality of lighting apparatuses 5200' and 5300' installed at every predetermined interval and connected to be available for communicating with the communications connection device 5100', a server 5400', a computer 5500' managing the server 5400', a communications base station 5600', a communications network 5700', a mobile device 5800', and the like.

Each of the plurality of lighting apparatuses 5200' and 5300' installed in an open outer space such as a street or a park may include smart engines 5210' and 5310', respectively. The smart engines 5210' and 5310' may include a light emitting device, a driver of the light emitting device, a sensor collecting information of a surrounding environment, a communications module, and the like. The smart engines 5210' and 5310' may communicate with other adjacent equipment by means of the communications module according to communications protocols such as Wi-Fi, ZigBee®, and Li-Fi.

For example, one smart engine 5210' may be connected to communicate with another smart engine 5310'. Here, a Wi-Fi extending technique (Wi-Fi mesh) may be applied to communications between the smart engines 5210' and 5310'. The at least one smart engine 5210' may be connected to the communications connection device 5100' connected to the communications network 5700' by wired/wireless communications. In order to increase communication efficiency, some smart engines 5210' and 5310' may be grouped and connected to the single communications connection device 5100'.

The communications connection device 5100' may be an access point (AP) available for wired/wireless communications, which may relay communications between the communications network 5700' and other equipment. The communications connection device 5100' may be connected to the communications network 5700' in either a wired manner or a wireless manner, and for example, the communications connection device 5100' may be mechanically received in any one of the lighting apparatuses 5200' and 5300'.

The communications connection device 5100' may be connected to the mobile device 5800' through a communications protocol such as Wi-Fi, or the like. A user of the mobile device 5800' may receive surrounding environment information collected by the plurality of smart engines 5210' and 5310' through the communications connection device 5100' connected to the smart engine 5210' of the lighting apparatus 5200' adjacent to the mobile device 5800'. The surrounding environment information may include nearby traffic information, weather information, and the like. The mobile device 5800' may be connected to the communications network 5700' according to a wireless cellular communications scheme such as 3G or 4G through the communications base station 5600'.

Meanwhile, the server 5400' connected to the communications network 5700' may receive information collected by the smart engines 5210' and 5310' respectively installed in the lighting apparatuses 5200' and 5300' and monitor an operational state, or the like, of each of the lighting apparatuses 5200' and 5300'. In order to manage the lighting apparatuses 5200' and 5300' on the basis of the monitoring results of the operational states of the lighting apparatuses 5200' and 5300', the server 5400' may be connected to the computer 5500' providing a management system. The computer 5500' may execute software, or the like, capable of monitoring and managing operational states of the lighting apparatuses 5200' and 5300', specifically, the smart engines 5210' and 5310'.

Figure 17:
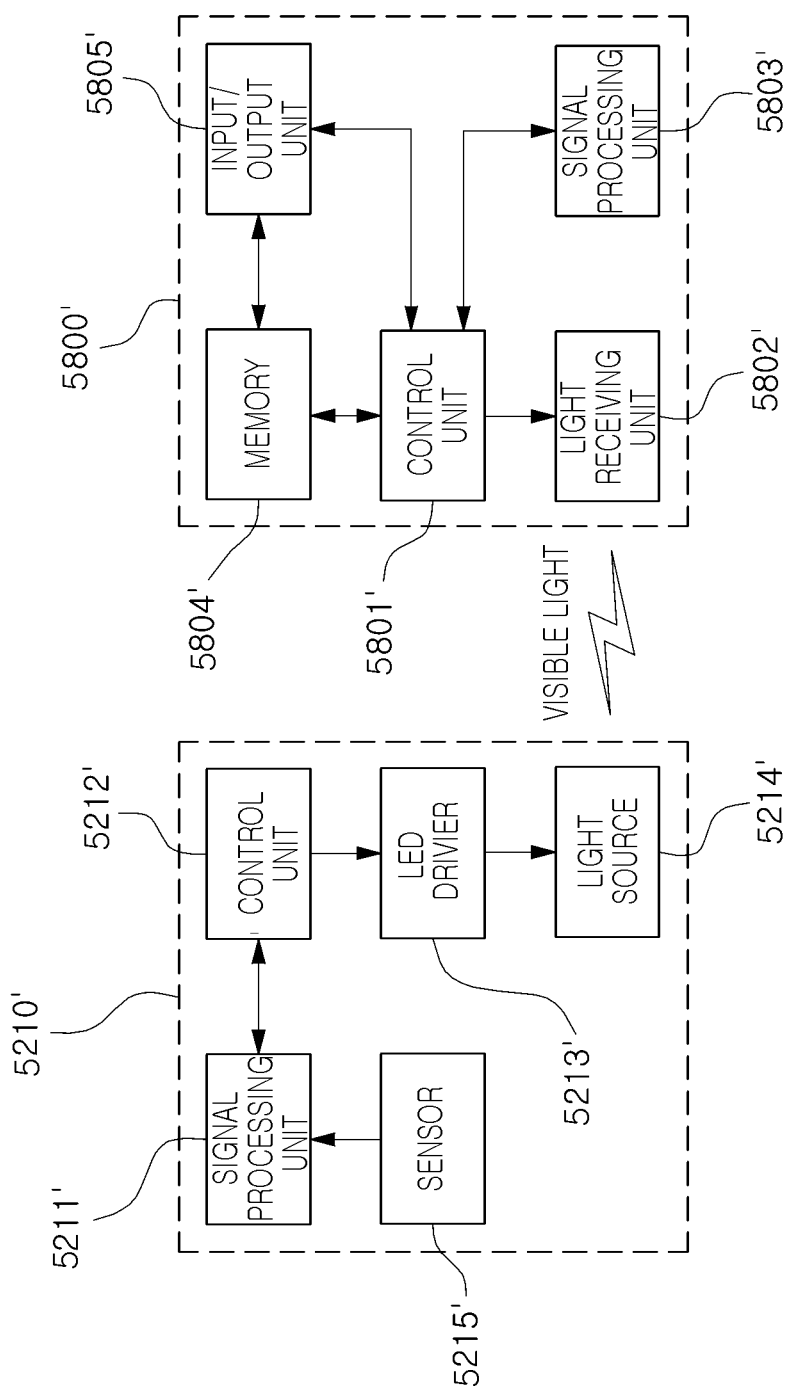
FIG. 17 is a block diagram illustrating a communications operation between a smart engine of a lighting apparatus and a mobile device according to visible light wireless communications.

FIG. 17 is a block diagram illustrating a communications operation between a smart engine of a lighting apparatus and a mobile device according to visible light wireless communications.

Referring to FIG. 17, the smart engine 5210' may include a signal processing unit 5211', a control unit 5212', an LED driver 5213', a light source unit 5214', a sensor 5215', and the like. The mobile device 5800' connected to the smart engine 5210' by visible light communications may include a control unit 5801', a light receiving unit 5802', a signal processing unit 5803', a memory 5804', an input/output unit 5805', and the like.

The visible light communications (VLC) technology (light fidelity (Li-Fi)) is a wireless communications technology transferring information wirelessly by using light having a visible light wavelength band recognizable to the naked eye. The visible light communications technology is distinguished from the existing wired optical communications technology and the infrared data association (IrDA) in that it uses light having a visible light wavelength band, namely, a particular visible light frequency from the light emitting device package according to the example embodiment described above and is distinguished from the existing wired optical communications technology in that a communications environment is based on a wireless scheme. Also, unlike RF wireless communications, the VLC technology (or Li-Fi) has convenience because it can be used without being regulated or authorized in the aspect of frequency usage, and VLC technology (or Li-Fi) has a distinction of having excellent physical security and allows for a user's verification of a communication link with his or her own eyes. Most of all, VLC technology (or Li-Fi) is differentiated in that it has features as a convergence technology that obtains both a unique purpose as a light source and a communications function.

The signal processing unit 5211' of the smart engine 5210' may process data intended to be transmitted and received by VLC. In an example embodiment, the signal processing unit 5211' may process information collected by the sensor 5215' into data and transmit the processed data to the control unit 5212'. The control unit 5212' may control operations of the signal processing unit 5211', the LED driver 5213', and the like, and in particular, the control unit 5212' may control an operation of the LED driver 5213' on the basis of data transmitted from the signal processing unit 5211'. The LED driver 5213' emits the light source unit 5214' according to a control signal transmitted from the control unit 5212', thereby transmitting data to the mobile device 5800'.

The mobile device 5800' may include the light receiving unit 5802' for recognizing visible light including data, in addition to the control unit 5801', the memory 5804' storing data, the input/output unit 5805' including a display, a touchscreen, an audio output unit, and the like, and the signal processing unit 5803'. The light receiving unit 5802' may sense visible light and convert the sensed visible light into an electrical signal, and the signal processing unit 5803' may decode data included in the electrical signal converted by the light receiving unit 5802'. The control unit 5801' may store the data decoded by the signal processing unit 5803' in the memory 5804' or may output the decoded data through the input/output unit 5805' to allow the user to recognize the data.

As set forth above, according to example embodiments, when the first white LED package and the second white LED package having different color temperatures are used to vary the color temperatures, color coordinates of final white light may be adjusted to be adjacent to a black body locus by adding a luminous flux of the green LED package. Additionally, a color rendering index may be improved to 80% or more, further, 85% or more. With only the additional configuration of the green LED package, even in a light apparatus having a wide color variation section (for example, 2700 to 6500K), white light meeting the CIE standard may be provided.

While example embodiments have been shown and described above, it will be apparent to those skilled in the art that modifications and variations could be made without departing from the scope of the invention as defined by the appended claims.

What is claimed is:

1. An LED lighting apparatus comprising:
a light housing;
a white light emitting module mounted in the light housing; and
a power supply unit supplying power to the white light emitting module,
wherein the white light emitting module includes:
a first white LED package configured to emit first white light corresponding to a quadrangular region defined by (0.3100, 0.3203), (0.3082, 0.3301), (0.3168, 0.3388) and (0.3179, 0.3282) in the CIE 1931 chromaticity diagram,
a second white LED package configured to emit second white light corresponding to a quadrangular region defined by (0.4475, 0.3994), (0.4571, 0.4173), (0.4695, 0.4207) and (0.4589, 0.4021) in the CIE 1931 chromaticity diagram,
a green LED package configured to emit green light having a peak wavelength of 520 nm to 545 nm, and
a driving controller controlling levels of luminous flux of the first white light and the second white light to select a color temperature of desired white light and controlling a luminous flux of the green LED package so as to reduce a difference between color coordinates corresponding to the selected color temperature of the desired white light, and a black body locus in the CIE 1931 chromaticity diagram.

2. The LED lighting apparatus of claim 1, wherein when a luminous flux ratio of the first white light, a luminous flux ratio of the second white light, and a luminous flux ratio of the green light are indicated as W1, W2 and G, respectively, W1+W2+G=100%, and each of W1 and W2 are complementarily changed within a range of 0 to 100%.

3. The LED lighting apparatus of claim 2, wherein the luminous flux ratio G of the green light is changed within a range of 0 to 10%.

4. The LED lighting apparatus of claim 1, wherein a color temperature of finally emitted white light is changed within a color temperature range of 2700K to 6500K.

5. The LED lighting apparatus of claim 1, wherein a color rendering index (CRI) of finally emitted white light is 80 or more.

6. The LED lighting apparatus of claim 1, wherein color coordinates of finally emitted white light are substantially changed according to the black body locus.

7. The LED lighting apparatus of claim 1, wherein the green light emitted by the green LED package has a full width at half maximum (FWHM) of 10 to 50 nm.

8. The LED lighting apparatus of claim 1, wherein at least one of the first white LED package and the second white LED package includes a plurality of white LED packages.

9. The LED lighting apparatus of claim 8, wherein at least a portion of the plurality of white LED packages emits light corresponding to different color coordinates in the CIE 1931 chromaticity diagram, and different types of light emitted by the plurality of white LED packages are mixed to allow for the emission of the first or the second white light.

10. The LED lighting apparatus of claim 1, wherein the first white LED package and the second white LED package respectively includes a plurality of white LED packages, and are alternately disposed.

11. The LED lighting apparatus of claim 10, wherein the green LED package includes a plurality of green LED packages.

12. The LED lighting apparatus of claim 11, wherein the first white LED package and the second white LED package and the green LED packages are disposed to be bisymmetrical to each other or rotationally symmetrical to each other.

13. The LED lighting apparatus of claim 1, further comprising: a light detector detecting and analyzing finally emitted white light,
wherein the driving controller receives analyzed information on the white light and based on received information, controls a luminous flux of at least one of the first white LED package and the second white LED package and the green LED package.

14. The LED lighting apparatus of claim 1, further comprising: a light diffuser disposed in an emission direction of final white light.

15. The LED lighting apparatus of claim 1, wherein color coordinates of finally emitted white light are substantially changed according to the black body locus.

16. A LED lighting apparatus, comprising:
a housing;
a white light emitting module mounted within the housing; and a power supply unit supplying power to the white light emitting module, wherein the white light emitting module includes:

a first white LED package configured to emit first white light in accordance with a first set of indices defining a first region in the CIE 1931 chromaticity diagram, a second white LED package configured to emit second white light in accordance with a second set of indices defining a second region in the CIE 1931 chromaticity diagram, a green LED package configured to emit green light having a peak wavelength of 520 nm to 545 nm, and a driving controller controlling levels of luminous flux of the first white light and the second white light to select a color temperature of desired white light and controlling a luminous flux of the green LED package so as to reduce a difference between color coordinates corresponding to the selected color temperature of the desired white light, and a black body locus (BBL) in the CIE 1931 chromaticity diagram.

17. The LED lighting apparatus of claim 16, wherein the first and second regions are quadrangular.

18. The LED lighting apparatus of claim 16, wherein the luminous flux ratio G of the green light is changed within a range of 0 to 10%.

19. The LED lighting apparatus of claim 16, wherein a color temperature of finally emitted white light is changed within a color temperature range of 2700K to 6500k.

* * * * *